United States Patent [19]

Shaw

[11] Patent Number: 5,075,620
[45] Date of Patent: Dec. 24, 1991

[54] HOT LINE INDICATOR

[75] Inventor: Lewis A. Shaw, Hastings, Mich.

[73] Assignee: Hastings Fiber Glass Products, Inc., Hastings, Mich.

[21] Appl. No.: 546,085

[22] Filed: Jun. 29, 1990

[51] Int. Cl.⁵ .................. G01R 1/02; G01R 19/14
[52] U.S. Cl. .................. 324/122; 324/126; 324/133; 340/660
[58] Field of Search ............... 324/127, 126, 122, 133, 324/128; 340/651, 652, 660, 661, 662, 663, 752, 753; 361/90, 91; 307/48, 64, 65, 66

[56] References Cited
U.S. PATENT DOCUMENTS

| | | | |
|---|---|---|---|
| 3,868,569 | 2/1975 | Faust | 324/126 |
| 3,987,393 | 10/1976 | Knauer | 324/133 |
| 4,079,978 | 3/1978 | McMullin | 248/188.5 |
| 4,096,434 | 6/1978 | Meyer | 324/127 |
| 4,152,639 | 5/1979 | Chaffee | 324/133 |
| 4,255,706 | 3/1981 | Soojian | 324/132 |
| 4,262,255 | 4/1981 | Kokei et al. | 324/122 |
| 4,348,666 | 9/1982 | Ogita | 340/753 |
| 4,570,117 | 2/1986 | Holt | 324/133 |
| 4,609,914 | 9/1986 | Fathi | 340/660 |
| 4,634,971 | 1/1987 | Johnson et al. | 324/133 |

Primary Examiner—Kenneth A. Wieder
Assistant Examiner—Vinh P. Nguyen
Attorney, Agent, or Firm—Flynn, Thiel, Boutell & Tanis

[57] ABSTRACT

A voltage detector/indicator unit includes a plurality of lights for indicating a voltage within one of a plurality of different voltage ranges by lighting the lights in a selected pattern.

17 Claims, 4 Drawing Sheets

HOT LINE INDICATOR

This invention relates to a voltage detector/indicator unit for providing an audio and/or visible indication of the voltage carried by high voltage electrical utility transmission lines and switchgear. The detector/indicator unit is mountable upon an electrically insulating pole, commonly referred to as a hot stick, for use by utility company linemen.

DESCRIPTION OF THE PRIOR ART

Portable meters suitable for measuring voltages have been widely utilized for many years. In such meters, the readout mechanism may be in the form of a digital display. Such displays offer higher resolution and imply more accuracy than it is possible to obtain when measuring the voltage on electrical utility lines. This could cause confusion of the utility company linemen. In some situations, the meter provides an audible and/or visible indication for indicating whether the voltage is above or below a predetermined value. However, it is desired to provide an indicator which can operate at several different voltage levels without requiring manual selection of a particular voltage range so that the operator can easily determine whether full line voltage or a lesser voltage is present on the power line being tested.

SUMMARY OF THE INVENTION

According to the invention, there is provided a voltage detector/indicator unit for use on electrical utility lines and switchgear which comprises a housing having a plurality of display means, such as lights, mounted thereon. A probe is mounted on the housing and is adapted to be placed in contact with an electrical utility line or switchgear for providing an input signal indicative of the voltage on the electrical utility line. The voltage detector/indicator unit includes circuitry providing a plurality of different reference voltages and a plurality of comparators each being connected for receiving the signal voltage and comparing it with one of the reference voltages. A plurality of output switches are provided and each of them is connected to one of the comparators so that each switch is actuated in response to an output from its associated comparator. Each switch in turn is coupled to one of the display means so that each of said display means can be operated when its associated switch is actuated.

DETAILED DESCRIPTION

Figure 1:
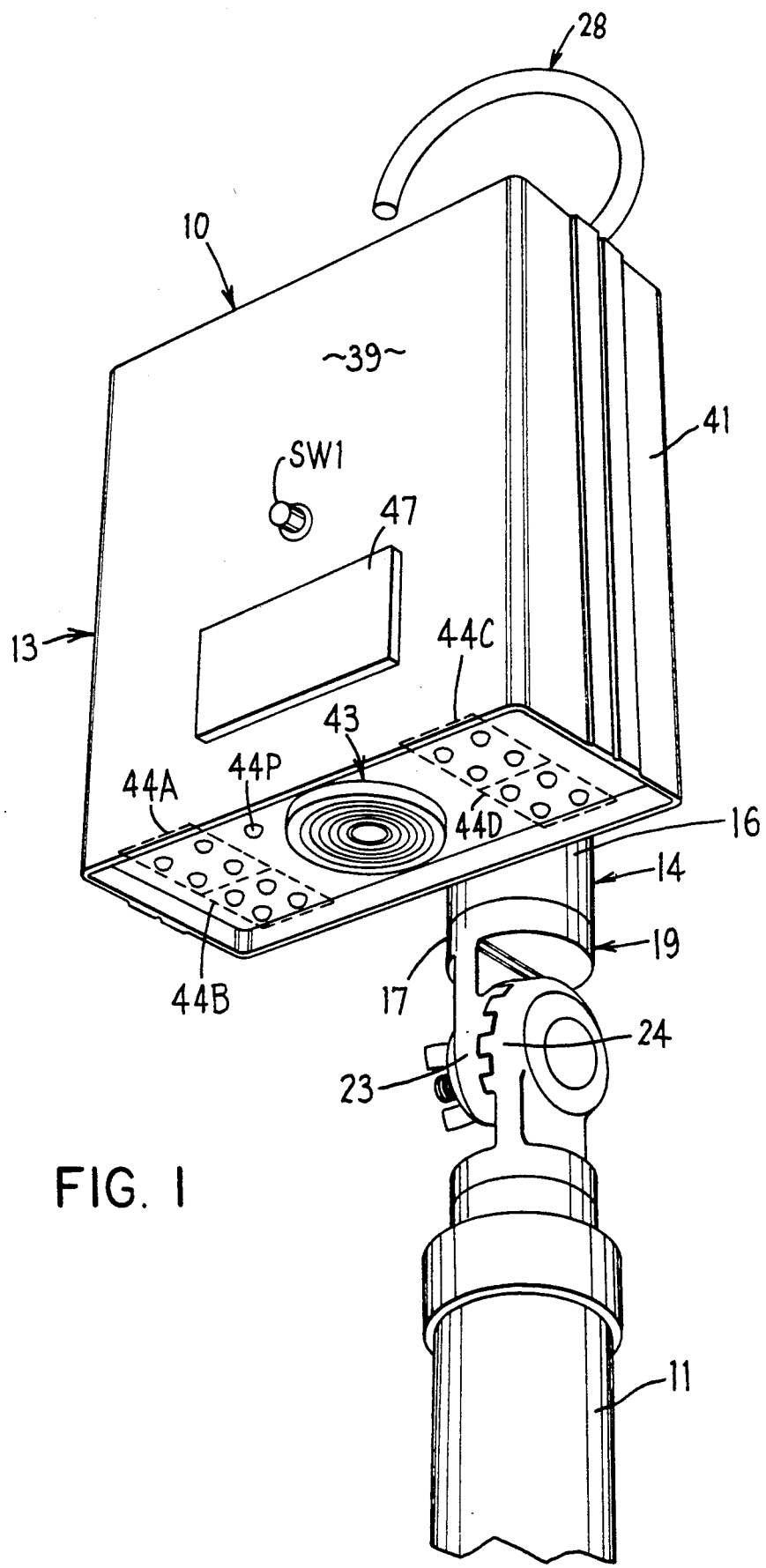
FIG. 1 is a perspective view of a fragment of a hot stick having mounted thereon the voltage detector/indicator unit according to the present invention.

The voltage detector/indicator unit 10, according to the present invention, is here shown as being mounted on a hot stick 11 so that the electrical company lineman can place the unit on an electrical utility line or switchgear which is located many feet above the ground. The hot stick 11 can be of any suitable type and forms no part of the present invention. An example of a suitable hot stick is disclosed in U.S. Pat. No. 4,079,978. The voltage detector/indicator unit 10 can also be used, in combination with commercially available bushing adapters for loadbreak bushings, to measure the voltage on underground equipment, such as pad mounted or underground switches and transformers.

The voltage detector/indicator unit 10 comprises a housing 13 for containing the electrical circuit elements of the unit, and a mounting structure 14.

The mounting structure 14 comprises a tubular support having an inner end 17 and an outer end 18. A universal mounting fitting 19 is provided on the inner end 17 of the support 16. The fitting 19 comprises a post 21 which is slidably received in the inner end of the tubular support 16 and is secured therein by an epoxy adhesive. A screw 22 is provided to hold the housing 13 to the tubular support 16 and to provide electrical contact between the circuit parts inside the housing 13 and the fitting 19. The screw 22 also helps to secure fitting 19 to the tubular support 16. The fitting 19 has an adaptor section 23 which is adapted to be coupled to a universal head 24 mounted on the end of the hot stick 11 in a conventional manner so that the support 16 can be disposed at a selectable angle to the longitudinal axis of the hot stick 11 and can be releasably clamped in such adjusted position.

Figure 2:
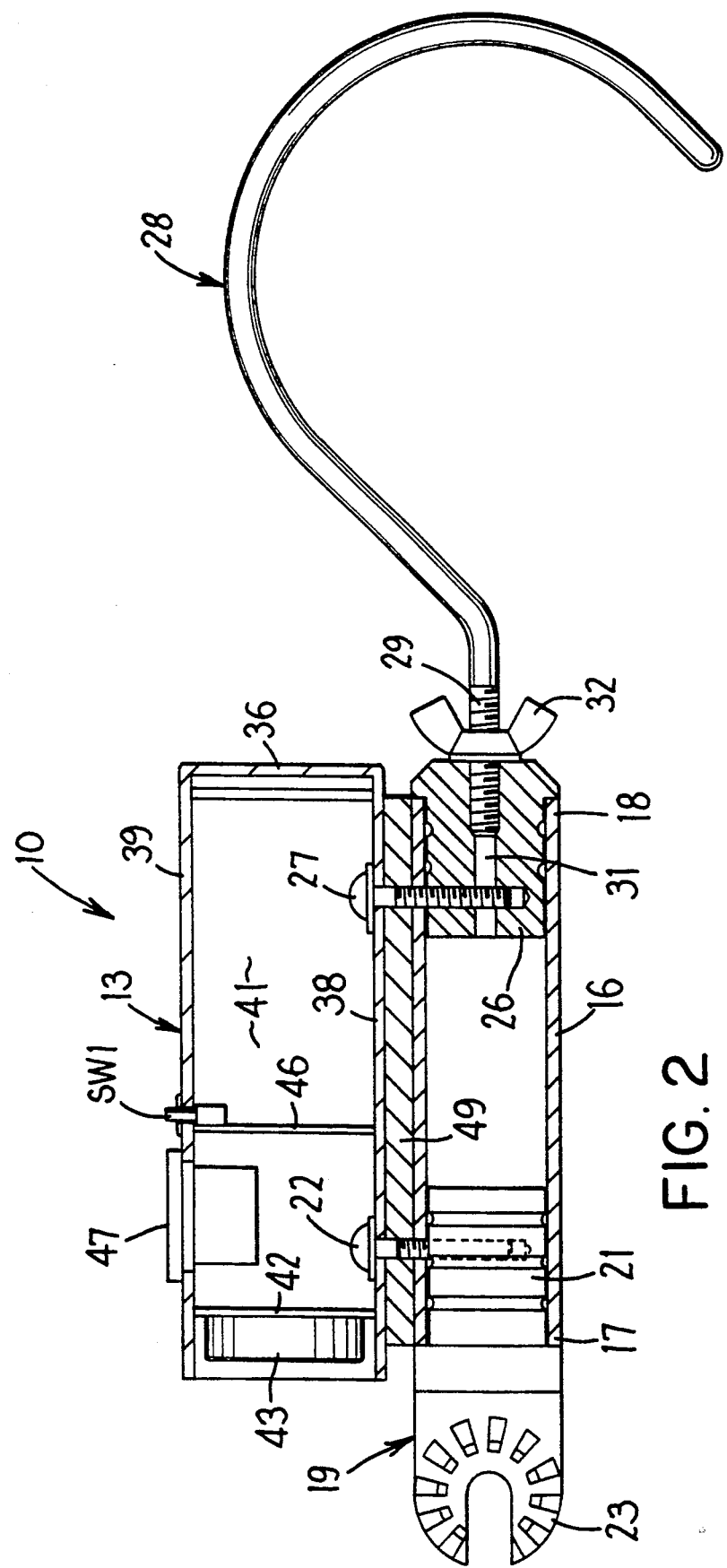
FIG. 2 is a central sectional view through the voltage detector/indicator unit.

Referring to FIG. 2, an end fitting 26 is slidably received in the outer end of the tubular support 16 and is releasably secured therein by an epoxy adhesive. A screw 27 is provided to hold the housing 13 to the tubular support 16 and to provide electrical contact between the circuit parts inside the housing 13 and the fitting 19. The screw 27 also helps to secure fitting 19 to the tubular support 16. A probe 28 has a shank 29 which is threaded into a central opening 31 in the end fitting and is releasably secured therein by a wing nut 32. The probe 28 is illustrated as being a curved probe which can be hung on the power line to be tested. It will be understood, however, that the probe 28 can be of any desired shape, such as a straight rod, or other suitable adapter for underground systems.

The housing 13 is of generally rectangular, box-like configuration and is comprised of an outer end wall 36, a base wall 38, a top wall 39 and a pair of sidewalls 41. The inner end wall of the housing 13 is defined by an end panel 42 on which are mounted an audible device 43, such as a horn or buzzer, and a plurality of visible indicators, here light-emitting diodes (LED). Referring to FIG. 1, there is a total of 17 LEDs comprised of a power indicator LED 44P, which may emit green-colored light, and four sets of LEDs 44A–44D, each set being comprised of four LEDs, which may emit red-colored light, arranged in a closely spaced group so that the light emitted therefrom will appear substantially as being one large light when viewed from a distance.

A printed circuit board 46 is mounted inside the housing 13. A battery 53 (FIG. 3) is removably mounted in a battery holder 47 for powering the electrical components of the voltage detector/indicator unit. A start switch SW1 is provided for starting operation of the unit 10.

A spacer 49 is provided between the base wall 38 of the housing 13 and the tubular support 16.

Figure 3:
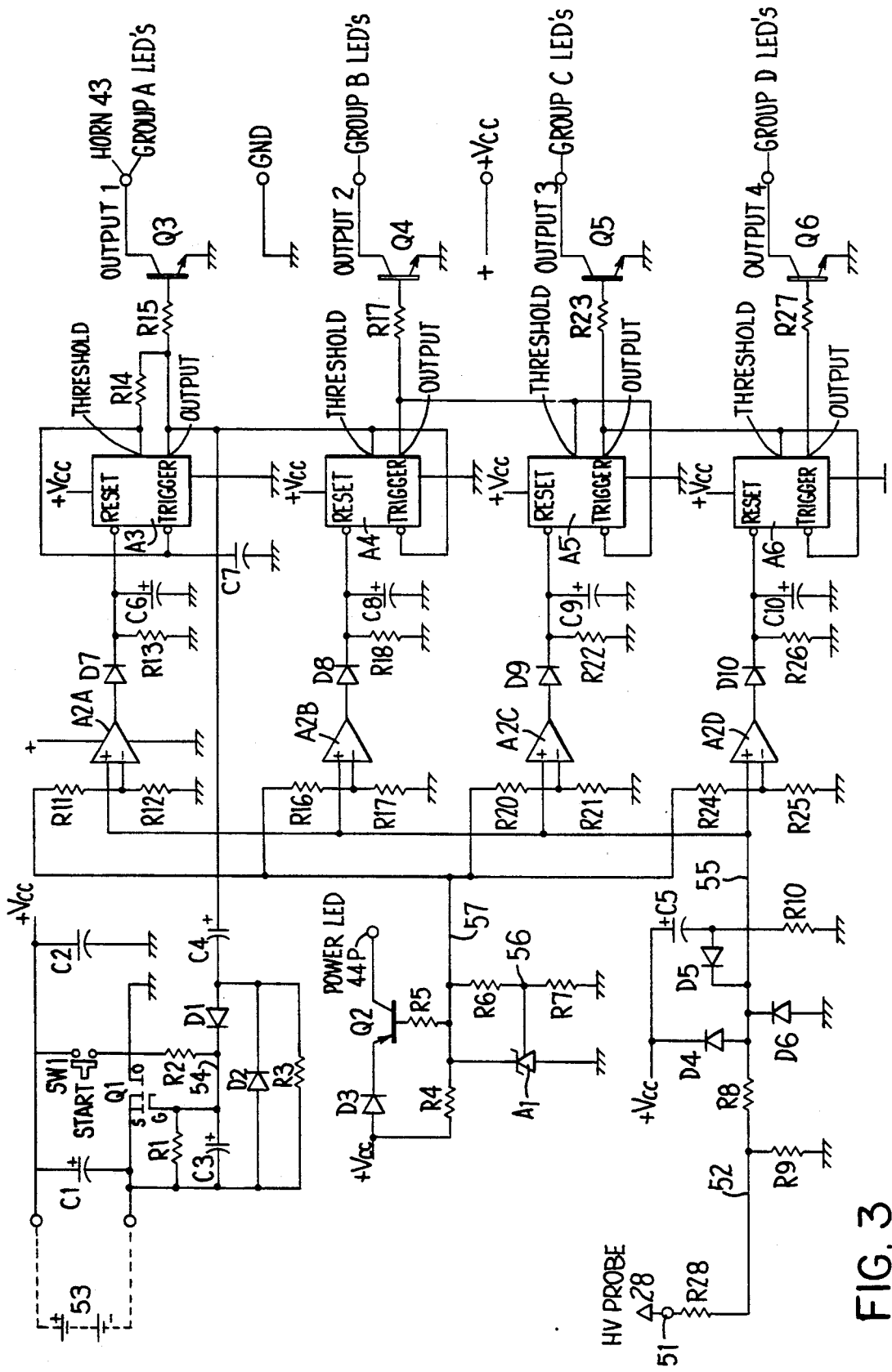
FIG. 3 is a circuit diagram for the voltage detector/indicator unit.
Figure 4:
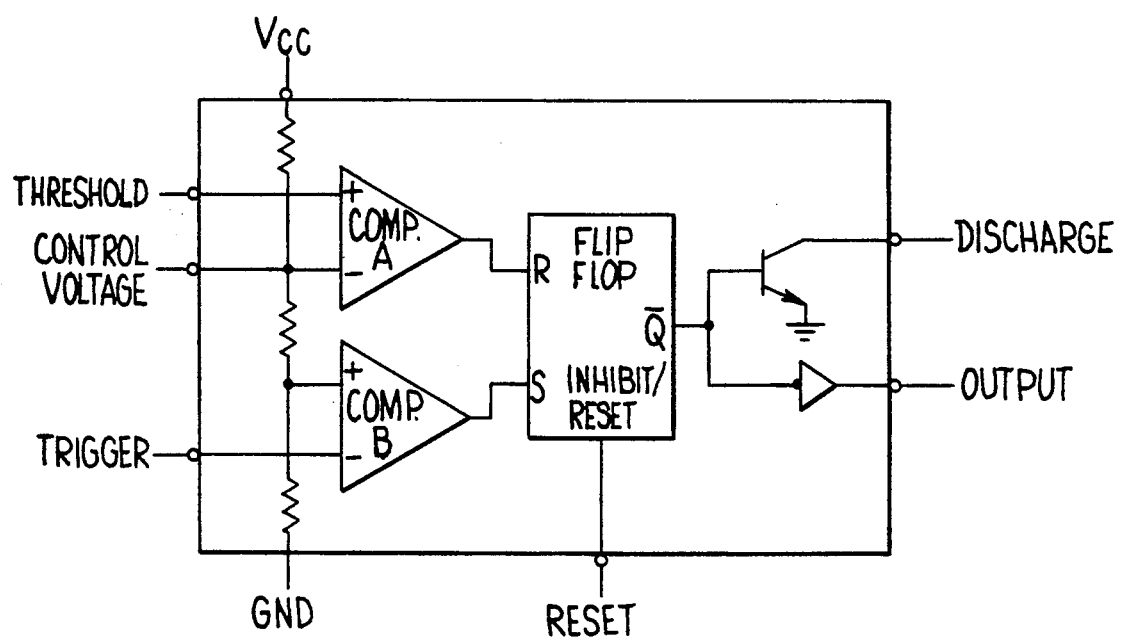
FIG. 4 is a block diagram of the integrated circuits A3, A4, A5 and A6.

Referring to FIG. 3, the probe 28 is connected through a resistor R28 to the terminal 51 of a conductor 52 in order to provide an input AC signal to the unit 10. A input load resistor R9 is connected between the conductor 52 and ground whereby to provide a reduced voltage on conductor 52 indicative of the voltage of the power transmission line being tested. The resistor R8 and diodes D4 and D6 form a voltage limiter so that the resulting clamped signal 55 is supplied to the positive terminals of four operational amplifier sections A2A, A2B, A2C and A2D in parallel. The sections A2A, A2B, A2C and A2D are provided by an integrated circuit commonly known identified as a quad differential input operational amplifier, one typical example of which is a Motorola LM-224 series integrated circuit. Such integrated circuits can operate at supply voltages as low as 3.0 volts and with low input bias currents.

The power control circuit is powered by a battery 53. The start switch SW1 is connected between the battery plus terminal and the conductor 54 through a resistor R2. A field effect transistor (FET) Q1 is provided to connect the battery minus terminal to ground. When the start switch SW1 is closed, the gate of FET Q1 is brought up to the battery plus voltage, which charges capacitor C3 and turns on FET Q1. The high conductivity of FET Q1 with a gate-to-source voltage of over 2.5 VDC will then connect the battery minus terminal to the circuit common.

If no input voltage from probe 28 is detected, the charge on capacitor C3 will drain through resistance R1 as the gate-to-source voltage on FET Q1 falls to 2.5 VDC, the conductivity of FET Q1 will rapidly decrease and the battery minus terminal will be disconnected from circuit common. The time for this process to occur can be, for example, about eight minutes.

If an input voltage from probe 28 is detected, the output 1 will oscillate, thereby causing the charge on capacitor C3 to be continuously refreshed by the action of capacitor C4 and diodes D1 and D2. The resistor R3 bleeds the charge from capacitor C4 when oscillation of the output 1 ceases.

The circuit comprised of capacitor C5, diode D5 and resistor R10 is a power-up alert circuit to provide an indication that the detector/indicator unit is working. When the power is turned on by closing the start switch SW1, the line $+V_{cc}$ goes to battery plus voltage above circuit common, dragging the plus end of capacitor C5 with it. Since capacitor C5 cannot charge instantaneously through resistor R10, the negative end of capacitor C5 also goes substantially to battery plus voltage. This pulls the signal line 55 to almost battery plus voltage. In a manner to be described below, this causes a full voltage visual and audible indication, to the user, that the unit is operating. As capacitor C5 charges, the voltage forced onto the line 55 declines, eventually to zero. As it declines, the visual indication to the user changes from all four groups of LEDs to three, two, one and then none.

When capacitor C5 is fully charged, the diode coupling through diode D5 becomes invisible because it is effectively paralleled by the protection diode D4 from the 1 input line 55 to the line $+V_{cc}$.

An internal voltage reference circuit is comprised of an integrated circuit A1 which is effective as a precision reference diode. A suitable integrated circuit for this purpose is Motorola TL431ILP. The reference diode A1 functions as a shunt so that its anode voltage is maintained at whatever is required to maintain its reference voltage at a selected value. When the battery 53 is a 9V battery, the reference diode A1 maintains a reference voltage at the point 56 of $+2.5$ VDC and generates 5.0 VDC in line 57. In the illustrated embodiment, the overall design is intended to work with a battery voltage range of from 10.5 VDC to less than 7.2 VDC. However, the basic accuracy of the unit is not significantly changed until the battery voltage is less than about 4 VDC, although the LEDs 44A-44D may be less bright.

The circuit comprised of diode D3, transistor Q2 and resistor R5 provides a means for sensing the battery voltage and it is used to control the power LED 44P on the panel 42. Transistor Q2 acts as a saturated switch when the battery voltage is above 6.8 VDC, while it is completely open at voltages below 6.2 VDC, thus turning off the power LED 44P. As indicated above, the device 10 will continue to work for several hours after the power LED 44P turns off because of the opening of transistor Q2, so that the user will have time to obtain another battery. It will be understood, however, that when Q1 is turned off, the circuit will also be turned off.

The reference voltage on line 57 is applied in parallel to the negative terminals of the operational amplifier sections A2A, A2B, A2C and A2D, through resistors R11, R16, R20 and R24 of different values. Resistors R12, R17, R21 and R25, also of different values, are connected between the negative terminals of the operational amplifier sections A2A, A2B, A2C and A2D and ground. Thus, the reference voltage on line 57 is divided into four reference voltages of different values which are applied to the negative terminals of the operational amplifier sections. For example, the reference voltage applied to the negative terminals can be 0.244V for section A2A, 0.854V for section A2B, 2.95V for A2C and 4.61V for A2D.

The clamped signal voltage received from line 52 through resistor R8 is compared with the reference voltage applied to the negative terminal in each of sections A2A, A2B, A2C and A2D. When the signal voltage is larger than one or more of the respective reference voltages, those sections will provide respective outputs which will be half-wave rectified by the respective diodes D7, D8, D9 and D10, and supplied to respective filter capacitors C6, C8, C9 and C10. The capacitors C6, C8, C9 and C10 are provided with bleeder resistors R13, R18, R22 and R26 to provide an appropriate turn-off delay. The resulting DC signals are supplied to integrated circuits A3, A4, A5 and A6 to turn on those circuits and thereby generate pulses.

The integrated circuits A3, A4, A5 and A6 are general purpose timing circuits capable of producing accurate time delays or oscillation. Suitable integrated circuits are Maxim ICM 7555, Motorola MC1455 and Signetics NE/SA/SE 556. The integrated circuit A3 is connected to freely oscillate, with its time constant being determined by capacitor C7 and resistor R14. For example, the frequency can be about 82 cycles per minute. The threshold terminals of the integrated circuits A4, A5 and A6 are each connected to the output terminal of the preceding stage so that their outputs alternate. The outputs of circuits A3, A4, A5 and A6 are connected through resistors R15, R17, R23 and R27, respectively, to the transistors Q3, Q4, Q5 and Q6. The transistors Q3-6 are provided to sink enough current for LED operation. The output 1 from transistor Q3 is applied to the audible device 43 and the group A LEDs, and the outputs 2, 3 and 4 are connected to the group B, C and D LEDs, respectively.

OPERATION

In use, the detector/indicator unit 10 is attached to an electrically insulating pole or hot stick 11 of suitable length. The start switch SW1 can then be turned on, which turns on the power to the unit 10. All the LEDs and the audio device will operate for a few seconds and then cycle off leaving only the power LED 44P lit. If no input signal is provided, the unit 10 will shut off automatically after about eight minutes. This will be indicated by turning off the power LED 44P.

When it is desired to use the unit to test the condition of a power line, the detector/indicator unit 10 is raised and moved toward the power line. As the unit 10 is moved toward the line and before contact is made, the first group A of LEDs and the audio device 43 may come on. Thus, if the power line has a voltage of more than a predetermined, for example, 600 VAC, the operational amplifier A2A and associated circuitry will supply pulses to circuit A3 which in turn will cause the audio device 43 to sound and the group A LEDs to flash. As the field gets stronger, additional groups B, C and D of the LEDs will be activated. The strongest field will be achieved when the probe 28 is in contact with the power line. For example, a voltage of 600 VAC will cause the group A LEDs to flash, a voltage of 2,000 VAC will cause the group A and group B LEDs to flash, a voltage of 7,000 VAC will cause the group A, group B and group C LEDs to flash and a voltage of 11,000 VAC will cause the group A, group B, group C and group D of LEDs to flash. As mentioned above, successive groups flash alternately. For example, when group D is on group B will be on and groups A and C will be off, and then when group D turns off group B will turn off and groups A and C will turn on.

After the voltage measurement has been made, the detector/indicator unit 10 can be removed from the wire and it will turn off in a selected time, for example, about eight minutes.

The voltage detector/indicator unit according to the present invention provides both an audio and visual signal and verifies line conditions prior to the installation of protective grounding equipment. The device provides four banks of lights and an audio indicator to warn the operator of a voltage potential. A manual selector switch is not required because the banks of LEDs are preprogrammed to operate at four different voltages. The operator can easily determine whether a full line voltage or a lesser voltage is present on the power line. The unit is designed for use only on bare conductors and on undergound equipment when the appropriate bushing adapter for a loadbreak bushing is used. It is not designed for use on shielded or fully insulated conductors.

Although a particular preferred embodiment of the invention has been described, the invention contemplates such changes or modifications therein as lie within the scope of the appended claims.

The embodiments of the invention in which an exclusive property of privilege is claimed are defined as follows:

1. A voltage detector/indicator for use on electric utility lines, comprising: a housing having first, second, third and fourth display devices mounted thereon, a probe mounted on said housing and adapted to be placed in close proximity or in contact with an electric utility line for providing an input signal indicative of the voltage on the electric utility line, means for providing a plurality of different reference voltages, means for providing four comparators, each comparator being connected for receiving said input signal and comparing it with a respective one of said reference voltages, four output switches each coupled to a respective one of said comparators so that each said switch is actuated in response to an output of its associated comparator, each said switch being coupled to a respective one of said display devices, said comparators being responsive to said reference voltages for causing said switches to operate said first, second, third and fourth display devices when the voltage on the electric utility line is above 600 VAC, about 2000 VAC, above 7000 VAC and above 11000 VAC, respectively.

2. A voltage detector/indicator as claimed in claim 1 in which said display devices are lights.

3. A voltage detector/indicator as claimed in claim 2 in which said display devices include an audio indicator.

4. A voltage detector/indicator as claimed in claim 1 in which said comparators are operational amplifiers operable by different inputs, said operational amplifiers being associated in a monolithic integrated circuit.

5. A voltage detector/indicator as claimed in claim 1 in which said switches are monolithic integrated circuit timing circuits.

6. A voltage detector/indicator as claimed in claim 1, wherein said means for providing said reference voltages includes a precision reference diode having a cathode connected through a first resistor to a source of DC power, having an anode connected to ground and having a reference terminal, a second resistor connected between said cathode and reference terminal of said reference diode, a third resistor connected between said reference terminal and ground, a plurality of fourth resistors which each have a first end and a second end, said first ends of said fourth resistors being connected to each other and to said cathode of said reference diode, and including a plurality of fifth resistors which each have a first end connected to ground and a second end connected to said second end of a respective said fourth resistor, each of said reference voltages being produced at said second end of a respective said fourth resistor.

7. A voltage detector/indicator as claimed in claim 6, wherein said source of DC power is a battery, and including battery monitoring means for sensing and displaying the status of the battery, said battery monitoring means including a further diode having an anode connected to said source of power and having a cathode, a transistor having an emitter connected to said cathode of said further diode and having a base and a collector, a sixth resistor having first and second ends which are respectively connected to said base of said transistor and said cathode of said reference diode, and a light which is provided on said housing and is connected to said collector of said transistor.

8. A voltage detector/indicator as claimed in claim 1, wherein said display devices each include a light, and wherein said output switches include: means for causing said lights of said first and second display devices to be actuated in an alternating manner when the voltage on the electric utility line is above 2000 VAC; means for causing said lights of said first and third display devices to be actuated simultaneously with each other and in an alternating manner with said light of said second display device when the voltage on the electric utility line is above 7000 VAC; and means for causing said lights of said first and third display devices to be actuated simultaneously with each other, said lights of said second and fourth display devices to be actuated simultaneously with each other, and said lights of said first and third display devices to be actuated in an alternating manner with respect to said lights of said second and fourth display devices when the voltage on the electric utility line is above 11000 VAC.

9. A voltage detector/indicator as claimed in claim 8, wherein each said display device includes three additional lights which are positioned closely adjacent and are actuated simultaneously with said first-mentioned light thereof.

10. A voltage detector/indicator as claimed in claim 9, wherein each said output switch includes an output diode having an anode connected to an output of a respective said comparator and having a cathode, a resistor having a first end connected to ground and a second end connected to said cathode of said output diode, a capacitor having a first end connected to ground and a second end connected to said cathode of said output diode, a timing circuit having an input connected to said cathode of said output diode and having an output, an output resistor having a first end connected to said output of said timing circuit and having a second end, and a transistor having a base connected to said second end of said output resistor, having an emitter connected to ground and having a collector connected to a respective one of said display devices.

11. A voltage detector/indicator as claimed in claim 8, wherein said first display device includes an audio horn which is actuated simultaneously with said light of said first display device.

12. A voltage detector/indicator for use on electric utility lines, comprising: a housing having a plurality of display means mounted thereon, a probe mounted on said housing and adapted to be placed in close proximity or in contact with an electric utility line for providing an input signal indicative of the voltage on the electric utility line, means for providing a plurality of different reference voltages, means providing a plurality of comparators, each comparator being connected for receiving said input signal and comparing it with one of said reference voltages, a plurality of output switches each coupled to one of said comparators so that each said switch is actuated in response to an output of its associated comparator, each said switch being coupled to one of said display means so that each said display means is operated when its associated switch is actuated, a battery in said housing for supplying operating power to said detector/indicator, and means for sensing the battery voltage and providing a signal when the battery voltage is below a selected level.

13. A voltage detector/indicator for use on electric utility lines, comprising: a housing having a plurality of display means mounted thereon, a probe mounted on said housing and adapted to be placed in close proximity or in contact with an electric utility line for providing an input signal indicative of the voltage on the electric utility line, means for providing a plurality of different reference voltages, means providing a plurality of comparators, each comparator being connected for receiving said input signal and comparing it with one of said reference voltages, a plurality of output switches each coupled to one of said comparators so that each switch is actuated in response to an output of its associated comparator, each switch being coupled to one of said display mans so that each said display means is operated when its associated switch is actuated, a battery in said housing for supplying operating power to said detector/indicator, a start switch for connecting said battery to said detector/indicator, the time delay means responsive to the absence of an input signal for disconnecting said battery from said detector/indicator.

14. A voltage detector/indicator as claimed in claim 13 including capacitance means connected in series with resistance means between ground and said operating power supplied from said battery when said start switch is closed so that said capacitance means charges over time in response to said start switch being closed, and diode means connected between said capacitance means and said comparators for effecting current flow to said comparators so that said switches are operated in response to said start switch being closed to thereby actuate said display means, said current flow through said diode means progressively decreasing so that said display means are deactuated as said capacitance means progressively charges.

15. A voltage detector/indicator as claimed in claim 13, wherein said time delay means includes a field effect transistor having a source connected to a negative terminal of said battery, having a drain connected to ground and having a gate, a first resistor having first and second ends which are respectively connected to said source and said gate of said transistor, a capacitor having first and second ends which are respectively connected to said source and said gate of said transistor, a manually operable switch having a first terminal coupled to a positive terminal of said battery and having a second terminal, a second resistor having a first end coupled to said second terminal of said switch and having a second end coupled to said gate of said transistor, a first diode having a cathode coupled to said gate of said transistor and having an anode, a second diode having an anode coupled to said source of said transistor and having a cathode coupled to said anode of said first diode, a third resistor having first and second ends respectively coupled to said anode and said cathode of said second diode, and a capacitor having a first end coupled to said anode of said first diode and a second end coupled to an output signal of one of said switches.

16. A voltage detector/indicator comprising probe means which can be placed adjacent an electric utility line for providing an input signal indicative of the voltage on the electric utility line, display means for providing displays representative of respective voltage values, and circuit means coupled to said probe means and to said display means and responsive to said input signal for causing said display means to produce a display representative of the voltage currently present on the utility line, said circuit means including a monolithic integrated circuit having an input, a first resistor having a first end connected to said probe means and having a second end, a second resistor having a first end connected to said second end of said first resistor and having a second end connected to ground, a third resistor having a first end connected to said second end of said first resistor and a second end connected to said input of said monolithic integrated circuit, a first diode having a cathode connected to a DC power source and an anode connected to said second end of said third resistor, and a second diode having a cathode connected to said anode of said first diode and having an anode connected to ground.

17. A voltage detector/indicator as claimed in claim 16 which also comprises an audio device connected for being operated by said circuit means.

* * * * *

UNITED STATES PATENT AND TRADEMARK OFFICE
CERTIFICATE OF CORRECTION

PATENT NO. : 5 075 620

DATED : December 24, 1991

INVENTOR(S) : Lewis A. SHAW

It is certified that error appears in the above-identified patent and that said Letters Patent is hereby corrected as shown below:

Column 3, line 57;  delete "1".

Column 3, line 62;  after "shunt" insert ---regulator---.

Column 7, line 63;  replace "mans" with ---means---.

Signed and Sealed this

Twenty-ninth Day of June, 1993

Attest:

MICHAEL K. KIRK

*Attesting Officer*  Acting Commissioner of Patents and Trademarks